(12) United States Patent
Chase et al.

(10) Patent No.: US 9,152,517 B2
(45) Date of Patent: Oct. 6, 2015

(54) PROGRAMMABLE ACTIVE THERMAL CONTROL

(75) Inventors: Harold Chase, Cedar Park, TX (US);
Dennis R. Conti, Essex Junction, VT (US); James M. Crafts, Warren, VT (US); David L. Gardell, Fairfax, VT (US); Andrew T. Holle, Austin, TX (US); Adrian Patrascu, Austin, TX (US); Jody J. Van Horn, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 561 days.

(21) Appl. No.: 13/091,879

(22) Filed: Apr. 21, 2011

(65) Prior Publication Data
US 2012/0272100 A1  Oct. 25, 2012

(51) Int. Cl.
| G06F 11/24 | (2006.01) |
| G06F 1/32 | (2006.01) |
| G06F 1/20 | (2006.01) |
| G01R 31/28 | (2006.01) |

(52) U.S. Cl.
CPC ............. *G06F 11/24* (2013.01); *G06F 1/206* (2013.01); *G06F 1/3203* (2013.01); *G01R 31/2877* (2013.01)

(58) Field of Classification Search
CPC ....... G06F 11/24; G06F 1/3203; G06F 1/206; G01R 31/2877
USPC ..................... 702/108, 117; 714/34, E11.029
See application file for complete search history.

(56) References Cited

U.S. PATENT DOCUMENTS

| 5,030,905 | A | | 7/1991 | Figal |
| 5,502,838 | A | * | 3/1996 | Kikinis .................... 713/501 |
| 5,789,723 | A | * | 8/1998 | Hirst ......................... 219/501 |
| 5,999,007 | A | | 12/1999 | Kimura |
| 6,055,658 | A | | 4/2000 | Jaber et al. |
| 6,215,324 | B1 | | 4/2001 | Yoshida |
| 6,404,219 | B1 | | 6/2002 | Yamamoto |
| 6,870,378 | B1 | | 3/2005 | Cole et al. |
| 7,023,229 | B2 | | 4/2006 | Maesaki et al. |
| 7,265,561 | B2 | | 9/2007 | Conti et al. |
| 7,345,495 | B2 | | 3/2008 | Dangelo et al. |

(Continued)

OTHER PUBLICATIONS

Sudarshan Bahukudumdi et al., "Power Management for Wafer-Level Test During Burn-In", 17th Asian Test Symposium, IEEE, 2008, pp. 231-235.*

(Continued)

*Primary Examiner* — Alexander Satanovsky
(74) *Attorney, Agent, or Firm* — Cantor Colburn LLP; Michael LeStrange (57) ABSTRACT

Test equipment provides interrupt capability to automatic testing as a means of actively controlling temperature of the device under test. A processor coupled to memory is responsive to computer-executable instructions contained in the memory. A test socket is coupled to a device under test and coupled to the processor. The processor is configured to interrupt an application pattern running on the device under test. In response to interrupting the application pattern, the processor is configured to cause a control pattern to run on the device under test and then cause the application pattern to restart running from the point of interruption on the device under test.

16 Claims, 7 Drawing Sheets

(56) References Cited

U.S. PATENT DOCUMENTS

| | | | |
|---|---|---|---|
| 7,447,602 B1* | 11/2008 | Bradley et al. | 702/60 |
| 7,458,000 B2* | 11/2008 | Gorman et al. | 714/733 |
| 8,316,250 B2* | 11/2012 | Trautman et al. | 713/320 |
| 2009/0060795 A1* | 3/2009 | Owen et al. | 422/100 |

OTHER PUBLICATIONS

Wan, et al., "An Analysis of Two-Heater Active Thermal Control Technology for Device Class Testing", IEEE Transactions on Components and Packaging Technologies, vol. 27, 2004, pp. 577-584.

* cited by examiner

| MEASURED VALUES 305 | | | DESIRED VALUE 310 | CALCULATED VALUES 315 | | | | |
|---|---|---|---|---|---|---|---|---|
| Toff (C) | Hi-Pwr (Watts) | Hi-Pwr Temp (C) | Lo-Pwr (Watts) | Tdesired (C) | Rth (Ohms) | Pavg (Watts) | Duty Cycle % | Interrupt Timer (RFSHtimer) (sec) | SRTN Length |
| 70 | 270 | 104 | 10 | 85 | 0.13 | 119.12 | 41.97 | 0.005 | 0.0069 |
| 70 | 210 | 100 | 10 | 85 | 0.14 | 105.00 | 47.50 | 0.005 | 0.0055 |
| 70 | 180 | 95 | 10 | 85 | 0.14 | 108.00 | 57.65 | 0.005 | 0.0037 |
| 70 | 175 | 88 | 10 | 85 | 0.10 | 145.83 | 82.32 | 0.005 | 0.0011 |
| ... | ... | ... | ... | ... | ... | ... | ... | ... | ... |

PROGRAMMABLE ACTIVE THERMAL CONTROL

BACKGROUND

Exemplary embodiments relate to thermal management, and more specifically, to thermal management of chips during testing.

Thermal management of microprocessors during the class testing plays a particular role in reducing cost while increasing yield and performance. As the performance of an integrated circuit (IC) is highly dependent on the temperature of the device, it is important to control the device temperature, commonly referred to as the junction temperature during device class testing because this is the step where device performance is gauged at the component level. Research has shown that any increase in temperature during this test step may reduce the speed of the device (e.g., its clock speed) by as much as 0.15% per degree Celsius and decrease the yield of the fastest processors. The final test also determines general characteristics, such as whether a device is defective or meets minimum functional performance specification. The issue in class testing is to maintain temperature around a set point even as device power changes. Thermal management is required for functional verification of the integrated circuit, e.g., microprocessor across its complete temperature application specification. Thermal management is also required to maintain mechanical alignment with all coupling techniques.

BRIEF SUMMARY

According to exemplary embodiments, a test equipment apparatus for providing interrupt capability to automatic testing is provided as a means of actively controlling the temperature of the device under test. A processor, coupled to memory, is responsive to computer-executable instructions contained in the memory. A test socket is coupled to a device under test and coupled to the processor. The processor is configured to interrupt a first pattern: the application pattern running on the device under test. In response to interrupting the pattern, the processor is configured to cause a second pattern: the control pattern to run on the device under test. In response to completion of control pattern, the processor is configured to cause application pattern to restart running from the point of interruption on the device under test.

According to additional exemplary embodiments, a test equipment apparatus for providing interrupt capability to automatic testing is provided. A processor coupled to memory is responsive to computer-executable instructions contained in the memory. A test socket is coupled to a device under test and coupled to the processor. The processor is configured to measure a first temperature during power off of the device under test, measure a first power in response to the application pattern, measure a second temperature and a second power in response to running a short section of a control pattern on the device under test, and calculate an application pattern duty cycle required to maintain the device under test at a predefined temperature. Duty cycle is the time running the application pattern divided by the total time executing the application pattern plus the time spent executing the control pattern.

Additional features are realized through the techniques of the present disclosure. Other systems, methods, apparatus, and/or computer program products according to other embodiments are described in detail herein and are considered a part of the claimed invention. For a better understanding of exemplary embodiments and features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features of the present disclosure are apparent from the following detailed description taken in conjunction with the accompanying drawings in which:

DETAILED DESCRIPTION

Exemplary embodiments described herein provide active thermal control (ATC) for a device being tested.

Figure 1:
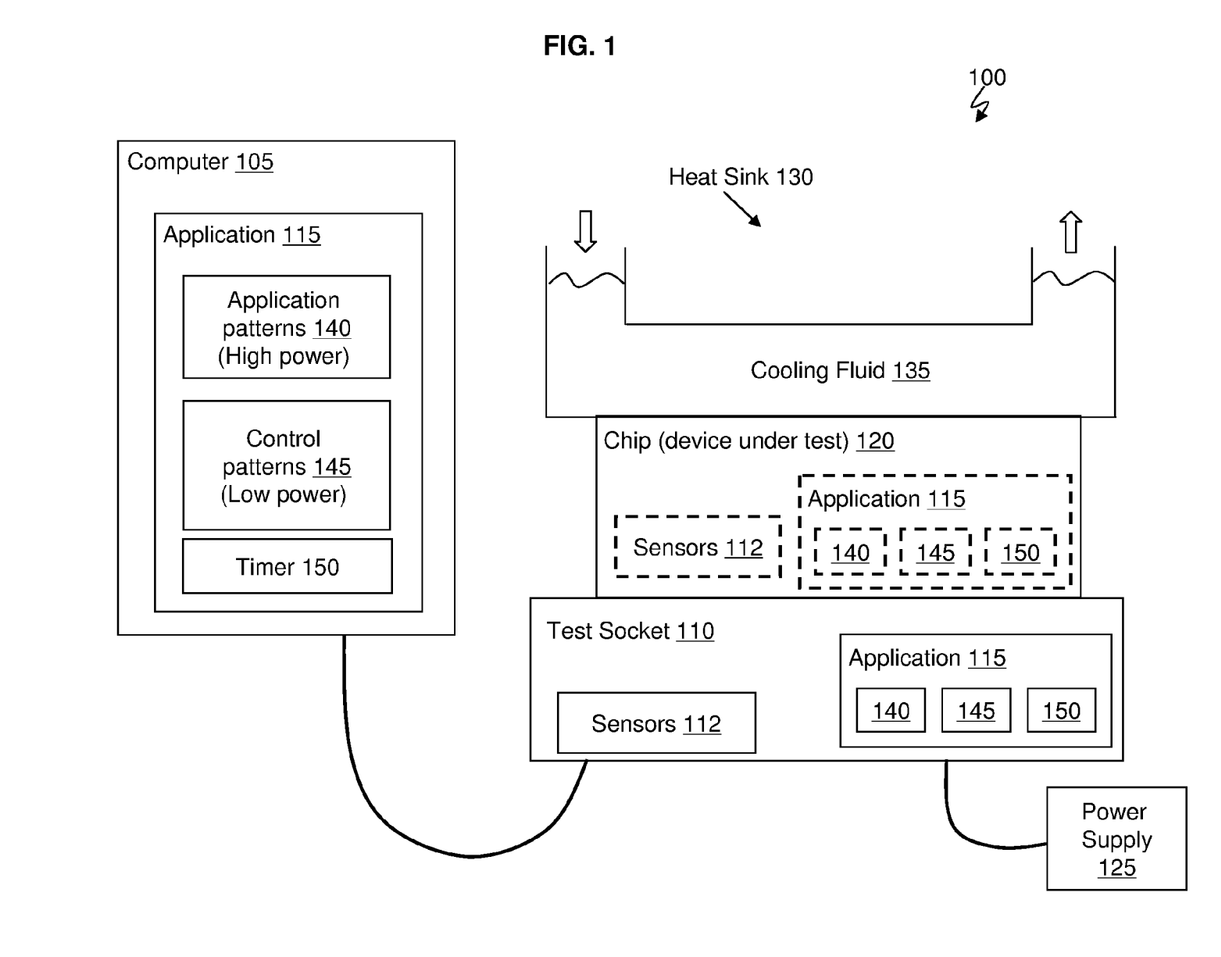
FIG. 1 illustrates an example automatic test apparatus in accordance with an exemplary embodiment.

FIG. 1 illustrates an example of automatic test equipment 100 according to exemplary embodiments.

The test equipment 100 may include a computer 105 operatively connected to a test socket 110. The computer 105 includes an application 115 that is configured to control the test socket 110. A chip 120 is connected to the test socket 110 for testing. The chip 120 may be referred to as the device under test (DUT) 120. A power supply 125 is connected to the test socket 110. The power supply 125 supplies power to the chip 120 via the test socket 110. The test socket 110 may be configured to test devices in various formats well known in the industry. For example individual chips such as known good die, chips in plastic packages, chips mounted to ceramic or organic substrates or chips may be in un-diced wafers, in this case, the test socket would also be known as a wafer probe and the heat sink would be known as a wafer chuck.

Additionally, the test equipment 100 may include a heat sink 130 temporarily attached to the chip 120 to cool the chip 120. A material may be inserted between the base of the heat sink 130 and the DUT 120 to provide better thermal conductivity between the two surfaces (e.g., a liquid with good thermal properties could be applied between the two surfaces). The heat sink 130 may have cooling fluid 135 (e.g., such as water) flowing through the heat sink 130 to assist in cooling the chip 120. In some cases, the air may be considered as the cooling fluid 135. Also, the heat sink 130 may be a passive heat sink or an active heat sink. A passive heat sink 130 does not react/change its heat removal capability as a function of the DUT's 120 power, an increase in DUT power will result in an increase in DUT temperature. An active heat sink attempts to maintain a constant chip temperature regardless of changes in chip power. An active heat sink's 130 heat removal capability is a function of the DUT's 120 power. Various active control heat sinks are known, but all have some shortcomings. In one type of active heat sink, a proportional integral derivative (PID) controller increases flow rate in response to increasing DUT power however these systems have limited response time which results in unacceptable transient temperature overshoot. Adding an electric heater to an active heat sink can improve response time but can limit the maximum allowable DUT power because of the limited heater power and the added thermal resistance of the heater layer.

During testing of the chip 120, the application 115 is configured to operate the chip 120 and/or cause the chip 120 to operate with a duty cycle that keeps the temperature (also called junction temperature) of the chip 120 within a prescribed range. In state of the art active control systems, it is not possible to tightly control the chip temperature, e.g., within a narrow temperature range and/or close to or at a predefined temperature when chip power suddenly changes.

However, in exemplary embodiments, the application 115 is configured to control duty cycle of the chip 120 which in effect controls the chip temperature with fine precision. The application 115 is configured to cause the chip 120 to operate with an application pattern resulting in an application thermal state 140 and a control pattern resulting in a control thermal state 145 based on a timer 150. The application pattern 140 may be considered a high power application, and the control pattern 145 may relatively be considered a low power application. In the state of the art, the application pattern could cause a large increase in DUT temperature and each chip will be at a different temperature; however in this embodiment the application pattern is paused before the application thermal state temperature can increase outside the prescribed range. When operating the chip 120 under the application pattern 140, the application pattern 140 may, e.g., cause a large amount of switching (e.g., transistor/FET switching) in the chip 120, cause a large amount of processing (of computer instructions, such as threads) in the chip 120, and/or cause a large amount of computational operations (such as mathematical computations) in the chip 120, all of which draws high current (power) from the power supply 125.

When operating the chip 120 under the control pattern 145, the control pattern 145 may cause zero or a small amount of switching on the chip 120, may cause zero or a small amount of processing on the chip 120, and/or may cause zero or a small amount of computational operations on the chip 120, all of which draws low current (power) from the power supply 125. The low power drew in the chip 120 causes the control thermal state to decrease relative to the application thermal state 140. According to exemplary embodiments, the application 115 instructs the chip 120 to switch between the application pattern 140 and the control pattern 145 which can cause the chip temperature to remain within the desired temperature range. The application 115 can instruct the chip 120 to operate with the application pattern 140 for a certain amount of time as counted by the timer 150 and instruct the chip 120 to operate with the control pattern 145 for a certain amount of time as counted by the timer 150.

Note that application thermal state and the control thermal state are relative to the chip 120 being tested, which is also referred to as the device under test (DUT) 120. For example, for a small chip 120 being tested with air cooling, 1 watt (W) may be considered high application thermal state, while 0.1 W is considered low application thermal state. In another case for a larger chip with water cooling, 270 W may be considered high application thermal state, while 20 W is considered low application thermal state. The timer 150 counts the time that the application pattern 140 runs and the time that the control pattern 145 runs in the chip 120. Based on the readings (e.g., time or count) of the timer 150, the application 115 via the test socket 110 causes the chip 120 to switch between running the application pattern 140 and the control pattern 145 according to a predefined duty cycle for operating the chip 120. The duty cycle, which comprises operating the application pattern 140 and the control pattern 145, is designed to correspond to a predefined/desired temperature for operating the chip 120; the application 115 via the test socket 110 can operate the chip 120 under test at any desired duty cycle to maintain the desired chip temperature.

The test equipment 100 may include processors, memory, software applications, and input/output devices for operating as discussed herein. The functionality of the computer 105 may be integrated in the test equipment 100 to form a single unit. Note that the whole or any part of the application 115 including the application pattern 140, the control pattern 145, and/or the timer 150 may be downloaded to or included in the test system 100. The test system 100 may also includes sensors 112 or circuits for measuring metrics on the chip 120 under test such as current, voltage, temperature, time, speed etc., at multiple locations (such as the multiple regions discussed in FIG. 4) in the chip 120. In one implementation, the whole or any part of the application 115 including the application pattern 140, the control pattern 145, and/or the timer 150 may be uploaded to the chip 120 to be run by the chip 120. Also, the chip 120 may include its own sensors 112 and circuits for measuring and outputting metrics to the test system 100.

Note that the application 115 can maintain the predefined temperature(s) for many different application patterns 140, where each application pattern 140 has its own operating characteristic power and/or thermal state for running the chip 120 under test. Some application patterns 140 may require that the chip 120 draws more power (watts) than another application pattern 140. Based on the power or thermal state of the particular application pattern 140 being run on the chip 120, the application 115 determines/calculates the appropriate duty cycle to keep the chip 120 at the predefined temperature. Different chips will generally run at different powers and thus will run at different duty cycles.

In one implementation, the control pattern 145 may be a nap state and/or sleep state of the chip 120. The nap state and sleep state are built-in states of the chip 120, and the application 115 causes the chip 120 to enter the nap state and/or sleep state according to the calculated duty cycle (following timer 150) for maintaining the predefined temperature of the chip 120. A nap state of the chip 120 turns off and/or reduces certain functions from operating in the chip 120 which correspondingly reduces the amount of power consumed by the chip 120 under test and thereby decreasing the thermal state. The sleep state of the chip 120 turns off and/or reduces even more functions from operating in the chip 120 (than the nap state does), and the sleep state further reduces the amount of power consumed by the chip 120 under test (than the nap state does) and thereby decreasing the control thermal state of the chip even further. Although the sleep state reduces the chip temperature more by reducing a larger amount of power consumed when running the control pattern 145, the sleep state takes longer for the chip 120 to enter into and to exit out of than the nap state. As such, the application 115 is configured to determine whether or not to switch/enter into the nap state or sleep state for cooling the chip 120 when executing the control pattern.

In one implementation of exemplary embodiments, the application 115 may be configured with the functionality of a memory test option (MTO) of the automated test equipment 100. The MTO option has the capability of testing dynamic random access memories (DRAMs). DRAMs must be refreshed every so often or the contents of their cells are lost.

The MTO option supports a programmable refresh timer such as the timer 150 and a programmable refresh subroutine (such as the control pattern 145) that is executed to replenish the charge on each DRAM cell. In exemplary embodiments, this MTO option may be utilized to support a programmable interrupt to the automatic test equipment 100 hardware processor, (e.g., interrupt the test socket 110) thereby halting the pattern (e.g., the application pattern) that is currently executing on the chip 120. Once the pattern (e.g., the application pattern 140) is stopped, the application 115 causes a programmable but predetermined subroutine (e.g., the control pattern 145) to be executed. Upon completion of the subroutine (control pattern 145) the original pattern (application pattern 140) continues operating in the chip 120 from where it left off. This interruption process continues according to a calculated duty cycle for maintaining the chip 120 at a predefined chip temperature. The periodicity of halting the pattern is programmed by the refresh interval timer, i.e., the timer 150. The timer 150 may be enabled under test program control.

The application pattern 140 time period must be short enough that the chip does not heat up above the desired range within a single pulse. The maximum allowable application time period can be estimated from well known equations, numerical modeling or it can be measured directly for each pattern.

Figure 2:
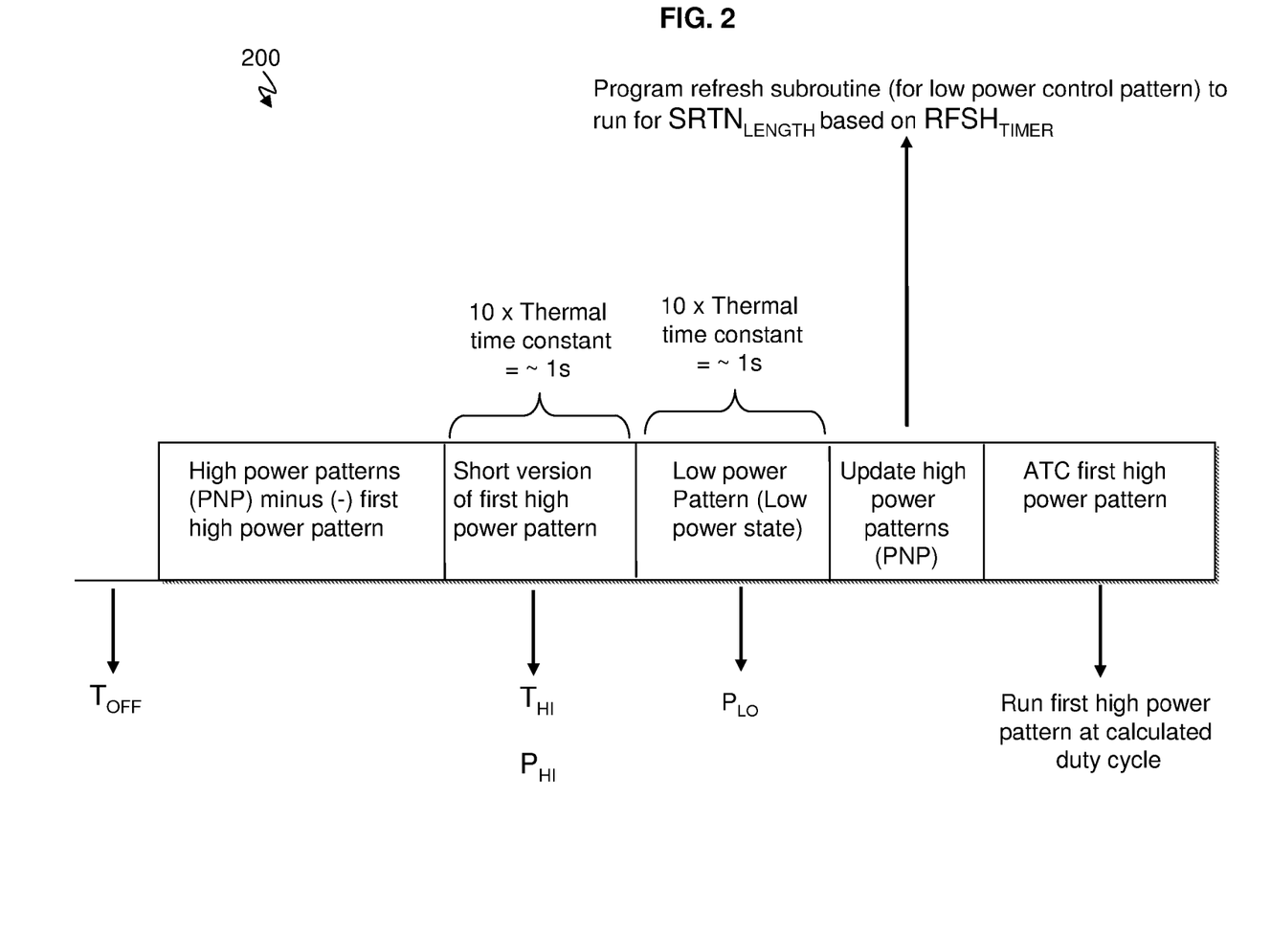
FIG. 2 illustrates a timeline graph in accordance with an exemplary embodiment.

Note that examples may be provided utilizing a temperature of 85 Celsius (C) for explanation purposes but it is understood that exemplary embodiments are not meant to be limited to a single temperature. FIG. 2 depicts a diagram 200 in which the application 115 calculates a duty cycle to maintain a device under test 120 at a predefined (desired) temperature according to exemplary embodiments. In the scenario below, the application 115 wants to execute a "worst case transistor/circuit switching" pattern, e.g., as the application pattern 140 at a chip temperature 85 C for the chip 120 under test. In FIG. 2, there may be many application patterns 140 for testing the chip 120, and the application 115 selects the first application pattern 140. After calculating the duty cycle for the first application pattern 140 at the predefined temperature, the application 115 can move to calculating the duty cycle for the second application pattern 140, and so forth. The application 115 can cause the chip 120 to run each application pattern (such as a first, second, third, etc. application pattern) according to a calculated duty cycle for each application pattern for a predefined temperature. The different application patterns may dissipate power in various areas of the DUT, thus having a different effect on the temperature sensor (s) resulting in different thermal resistances.

In the example, $T_{OFF}$ (C)=temperature of the device under test (DUT) with no power applied to the device under test (DUT). $T_{OFF}$ may be measured directly or assumed to be the set point temperature of the heat sink. $P_{HI}$ (watts)=amount of power required by the DUT when the (first) application pattern 140 is running $T_{HI}$=temperature of DUT when the application pattern 140 is applied by the application 115 via the test socket 110. $P_{LO}$=amount of power required by the DUT when the control pattern 145 is running $T_{DES}$=desired (predefined) time average temperature at DUT when testing. DC=the calculated duty cycle to maintain the chip 120 (or any region of the chip 120) at the desired temperature $T_{DES}$. $R_{TH}$=thermal resistance. Thermal resistance is temperature increase normalized by power, and the $R_{TH}$ units are degrees C. per Watt. Thermal resistance will change depending on how long the power has been applied for, device size, heat sink type and the quality of the thermal interface material between the chip and sink. Thus it is desirable but not required to measure the thermal resistance of each device as it is tested. $P_{AVG}$=the time average power required to operate the DUT at the desired time average temperature $T_{DES}$. RFSH (refresh interval timer)=is the time for running the application pattern 140. SRTN=the length of time for running the subroutine, i.e., control pattern 145. Both the $RFSH_{TIMER}$ (refresh interval timer) and $SRTN_{LENGTH}$ can be implemented by the timer 150. Trange is the desired temperature range; this is the small temperature increase and decrease each time the application pattern 140 is turned on and off.

As seen in FIG. 2, initially the handler set temperature is 70 C (the DUT power-off temperature) which is $T_{OFF}$. The application 115 causes a short run of the application pattern 140 to be executed on the chip 120 under test, e.g., the application pattern 140 may be run for 1 sec. The application 115 via the test socket 110 measures the power $P_{HI}$ at 270 W and measures the temperature $T_{HI}$ at 104 C at the end of the short run of the application pattern 140. The application 115 causes a short run of the control pattern 145 to be executed and the measured power $P_{LO}$ is 20 W. The application 115 is configured to perform calculations utilizing the following equations.

$$R_{th} = \frac{T_{HI} - T_{OFF}}{P_{HI}} \quad \text{Equation 1}$$

$$P_{AVG} = \frac{T_{DES} - T_{OFF}}{R_{TH}} \quad \text{Equation 2}$$

$$DC = \frac{[P_{AVG} - P_{LO}]}{[P_{HI} - P_{LO}]} \quad \text{Equation 3}$$

$$SRTN = \frac{[RFSH]}{[DC]} - RFSH \quad \text{Equation 4}$$

Equation 1 is the definition of thermal resistance, equation 2 is the same as equation 1 but rewritten for time average power and temperature. Equation 4 is obtained by rearranging the definition of duty cycle, DC=RFSH/(RFSH+SRTN). Equation 3 is developed by algebraically combining equation 2 with the definition of time average power Pavg= ($P_{HI}$*RFSH+$P_{LO}$*SRTN)/(RFSH+SRTN). As measured by the application 115 for this scenario, the measured values may include the following: $T_{OFF}$=70 C; $T_{HI}$=104 C; $P_{HI}$=270 W; $P_{LO}$=20 W. The temperature rise is measured at 1 C after the application pattern 140 is applied for a time of 8 ms. As the given values, the desired (predefined) temperature $T_{DES}$=85 C and Trange is 1 C. The refresh interval time $RFSH_{TIMER}$ is set at 5 ms to ensure Trange is not exceeded. The application 115 can select any convenient RFSH time that is less than the measured or estimated time that will cause the temperature to rise above Trange.

By inputting the measured values and the desired temperature in the Equations 1, 2, 3, and 4, the application 115 is configured to calculate the following for the DUT (e.g., chip 120).

$$R_{th} = \frac{T_{HI} - T_{OFF}}{P_{HI}} = 0.13 \text{ C/W} \quad \text{Equation 1}$$

$$P_{AVG} = \frac{T_{DES} - T_{OFF}}{R_{TH}} = 119.1 \text{ W} \quad \text{Equation 2}$$

$$DC = \frac{[P_{AVG} - P_{LO}]}{[P_{HI} - P_{LO}]} * 100 = 39.65\% \quad \text{Equation 3}$$

$$SRTN_{LENGTH} = \frac{[RFSH_{TIMER}]}{[DC]} - RFSH_{TIMER} = 7.6 \text{ ms} \quad \text{Equation 4}$$

The application pattern 140 (e.g., Power Virus) at $P_{HI}=270$ W and the control pattern 145 at $P_{LO}=20$ W are time averaged. The power on time RFSH is set to a low enough time to ensure a small temperature change during each power on cycle. Accordingly, the refresh time interval of the timer 150 is set to count for 5 ms. A duty cycle DC of 39.65% is calculated by the application 115 to provide a DUT temperature of 85 C. Once the duty cycle DC is known, the time required for the control pattern 145 (e.g., the subroutine length) can be calculated at 7.6 ms by the application 115. Accordingly, to notify the application 115, the timer 150 can also be set to count for 7.6 ms as the time for running the control pattern 145 before returning back to running the next section of the application pattern 140. The application 115 can be updated that the first application pattern 140 for the PNP is to be run for the calculated duty cycle. The application 115 may then execute automatic thermal control (ATC) by causing the chip 120 to operate at the calculated duty cycle 39.65. Additionally and/or alternatively, the application 115 may calculate the duty cycle for the next application pattern 140 in the PNP. In various embodiments, some and/or all of the measurements and calculations may be done at various times. For example, in one embodiment, a single chip may be characterized to determine RFSH and SRTN for each pattern, and these values will be used to test all chips of the same type. In an alternate embodiment, each chip may be characterized at the start of test of that chip. These embodiments can be considered predictive active temperature control. In yet another embodiment, RFSH and or SRTN may be updated continuously and/or periodically throughout the test of every pattern on every chip based on the difference between the measured and set point temperatures. This embodiment can be considered continuous active temperature control with feedback. An embodiment may include predictive and continuous active temperature control.

To execute the duty cycle DC for the desired temperature, there may be a tradeoff by having an increased test time. A 39.65% duty cycle relates to, e.g., a 2.5× increase in test time for this example application pattern 140, where X is the normal test time.

Figure 3:
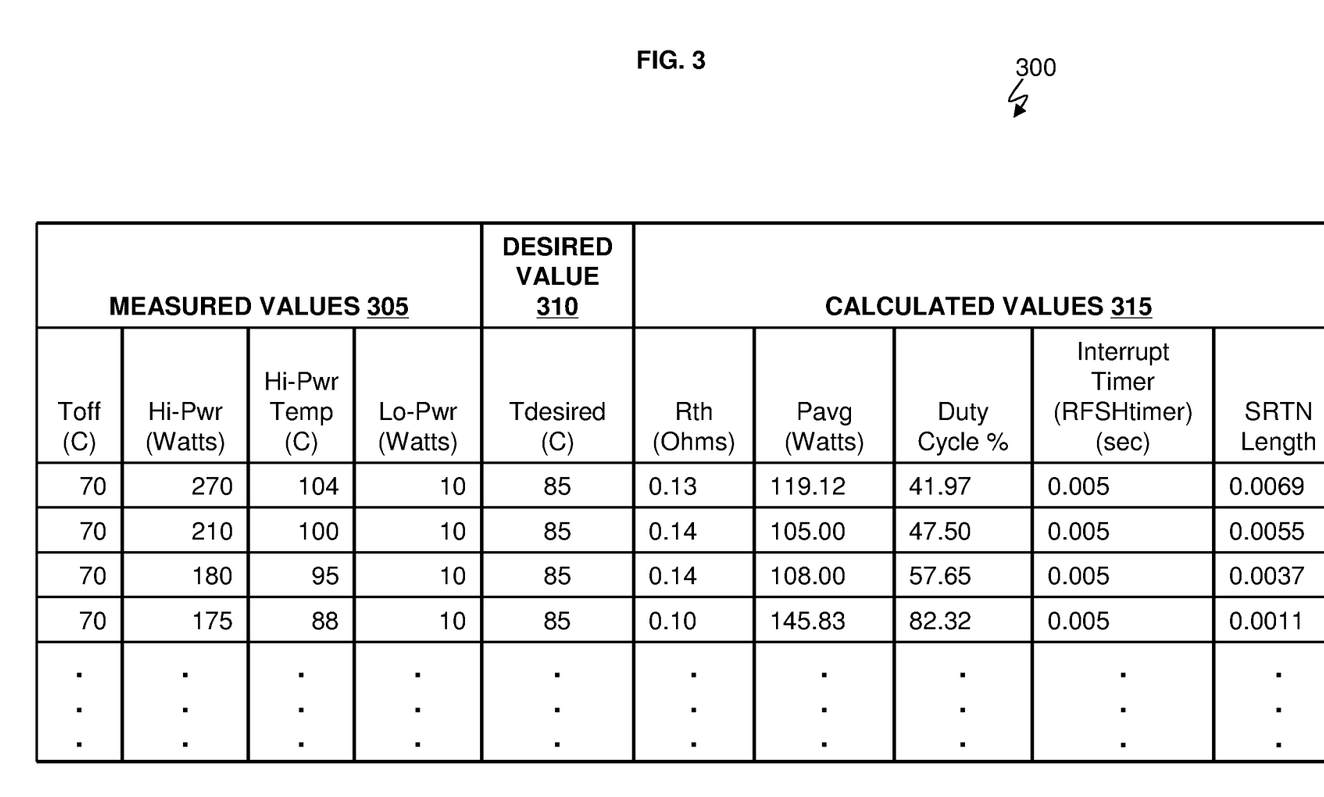
FIG. 3 illustrates a chart in accordance with an exemplary embodiment.

FIG. 3 illustrates a chart 300 of the application 115 calculating various duty cycles according to exemplary embodiments. The chip 120 may represent many different types of devices for testing. Each device may have different operational characteristics.

In the chart 300, the application 115 measures/receives the measured values 305. The application 115 may automatically set the desired temperature value 310 based on the type of chip 120 under test and/or based on receiving an input by a user. Given the measured values 305 and the desired temperature value 310, the application 115 is configured to calculate the calculated values 315 utilizing Equations 1, 2, 3, and 4.

Figure 4:
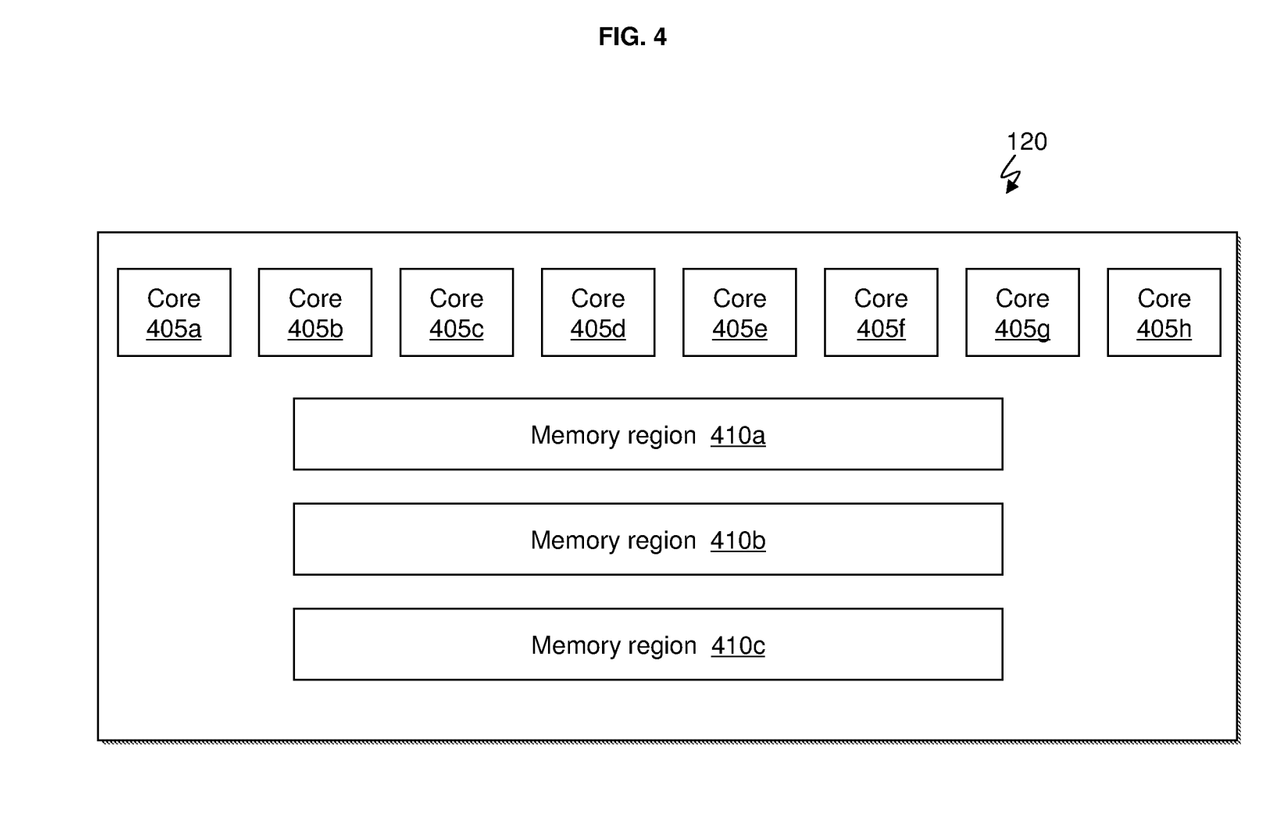
FIG. 4 illustrates a device under test with multiple regions in accordance with an exemplary embodiment.

Further, the application 115 is also configured to control the chip 120 to maintain multiple temperatures in multiple regions of the chip 120 under test according to exemplary embodiments as illustrated in FIG. 4. FIG. 4 illustrates the chip 120 with multiple processor core regions 405a-h and multiple memory regions (e.g., caches) 410a-c. Although FIG. 4 illustrates 8 processor core regions 405 and 3 memory regions 410, exemplary embodiments are not meant to be limited. Further, although not illustrated for conciseness in FIG. 4, it is appreciated that the elements shown in FIG. 1 are connected to the device under test (chip 120).

By calculating the duty cycle as discussed herein, the application 115 is configured to cause one desired temperature in one processor core region 405 and another desired temperature in another processor core region 405. Also, by calculating the duty cycle as discussed herein the application 115 is configured to cause one desired temperature in one memory region 410 and another desired temperature in another memory region 410. The application 115 is configured to cause a plurality of different desired temperatures in at least one or more processor core regions 405 and/or one or more memory regions 410.

The application 115 is configured to cause the chip 120 under test to run a application pattern 140 that causes operations in certain processor core regions 405 while not in other processor core regions 405, in certain memory regions 410 while not in other memory regions 410, and/or in a group of processor core and memory regions 405 and 410 while not in another group of processor core and memory regions 405 and 410. By running the chip 120 (with application patterns 140 and control patterns 145 at the calculated duty cycles) to draw different amounts of power in different regions 405 and/or 410, the chip 120 can be automatically controlled (by the application 115) to have a plurality of different desired temperatures in any of the different regions 405 and/or 410.

For example purposes, each processor core region 405 may be configured with a processor core to run 4 threads at a time. As such, the 8 processor cores can simultaneously run 32 threads in the chip 120. For each application pattern 140, the application 115 can utilize thread binding to individually assign operations to a single processor core region 405 to cause a temperature increase (according to a calculated duty cycle) in that particular processor core region 405, while not in other processor core regions 405. Similarly, for each application pattern 140, the application 115 is configured to utilize memory binding also referred to as memory affinity to individually assign memory operations to a single memory core region 410 to cause a temperature increase (according to a calculated duty cycle) in that particular memory region 410, while not in other memory core regions 410.

For example, the application 115 may be set to maintain a first desired temperature in processor core region 405a, a second desired temperature in processor core region 405b, a third desired temperature in processor core region 405c, a fourth desired temperature in processor core region 405d, a fifth desired temperature in processor core region 405e, a sixth desired temperature in processor core region 405f, a seventh desired temperature in processor core region 405g, and/or an eighth desired temperature in processor core region 405h; as such each of the first through eight desired temperatures may each have a different calculated duty cycle. In accordance with the calculated duty cycle for each processor core region 405, with the desired temperatures for each processor core region 405, and with the threads assigned to each processor core region 405, the first through eighth desired temperatures may all be different desired temperatures, some may be different desired temperatures, some may be the same desired temperatures, and/or all may be the same desired temperatures.

Likewise, the application 115 may be set to maintain a first desired temperature in memory region 410a, a second desired temperature in memory region 410b, and a third desired temperature in memory region 410c. In accordance with the calculated duty cycle for each memory region 410, the desired temperatures for each memory region 410, and the memory operations assigned to each memory region 410, the first through third desired temperatures may all be different desired temperatures, some may be different desired temperatures, some may be the same desired temperatures, and/or all may be the same desired temperatures.

Figure 6:
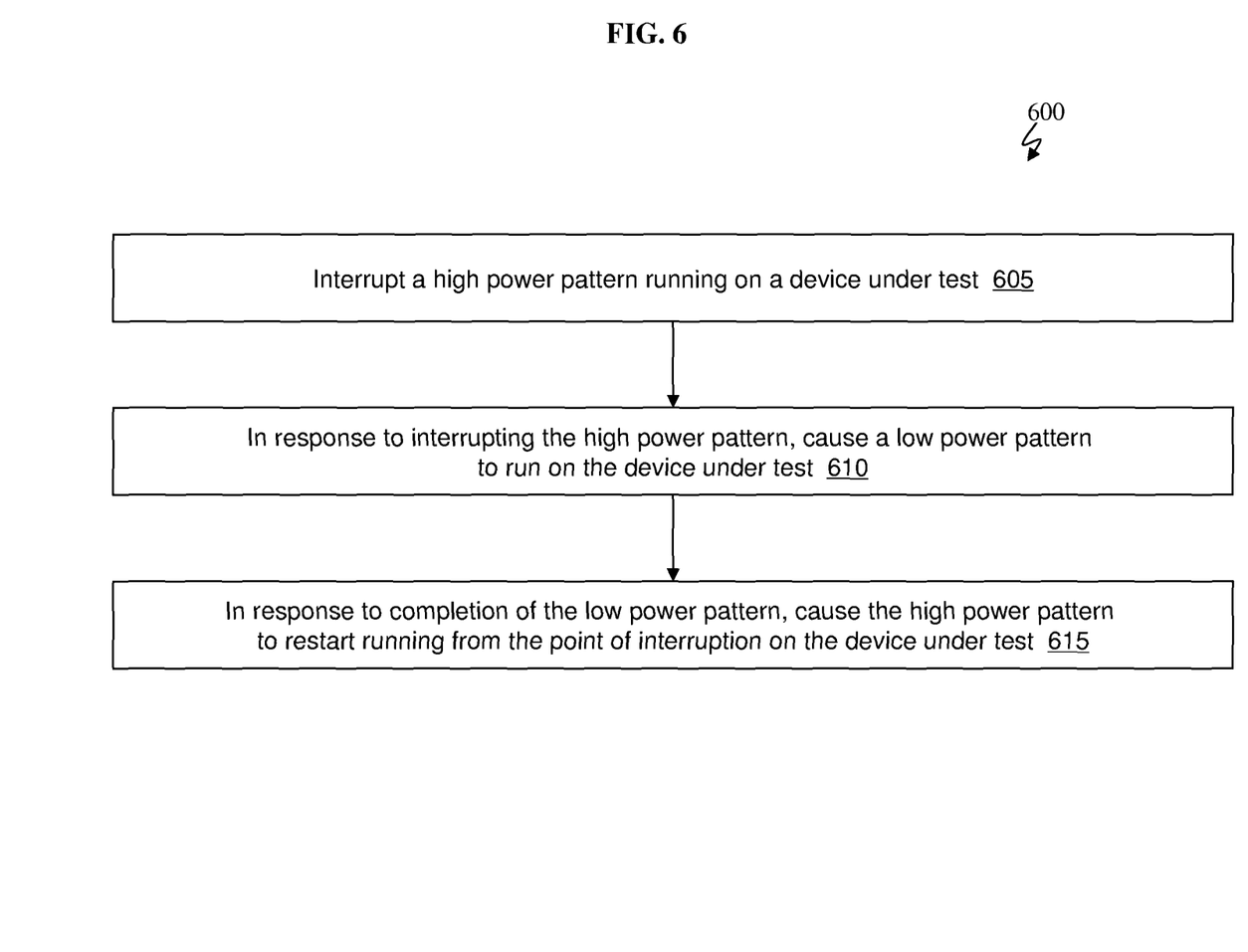
FIG. 6 illustrates a flow chart in accordance with an exemplary embodiment.

Now turning to FIG. 6, FIG. 6 illustrates a method 600 of test equipment 100 for providing interrupt capability for automatic testing via the application 115 according to exemplary embodiments.

Figure 7:
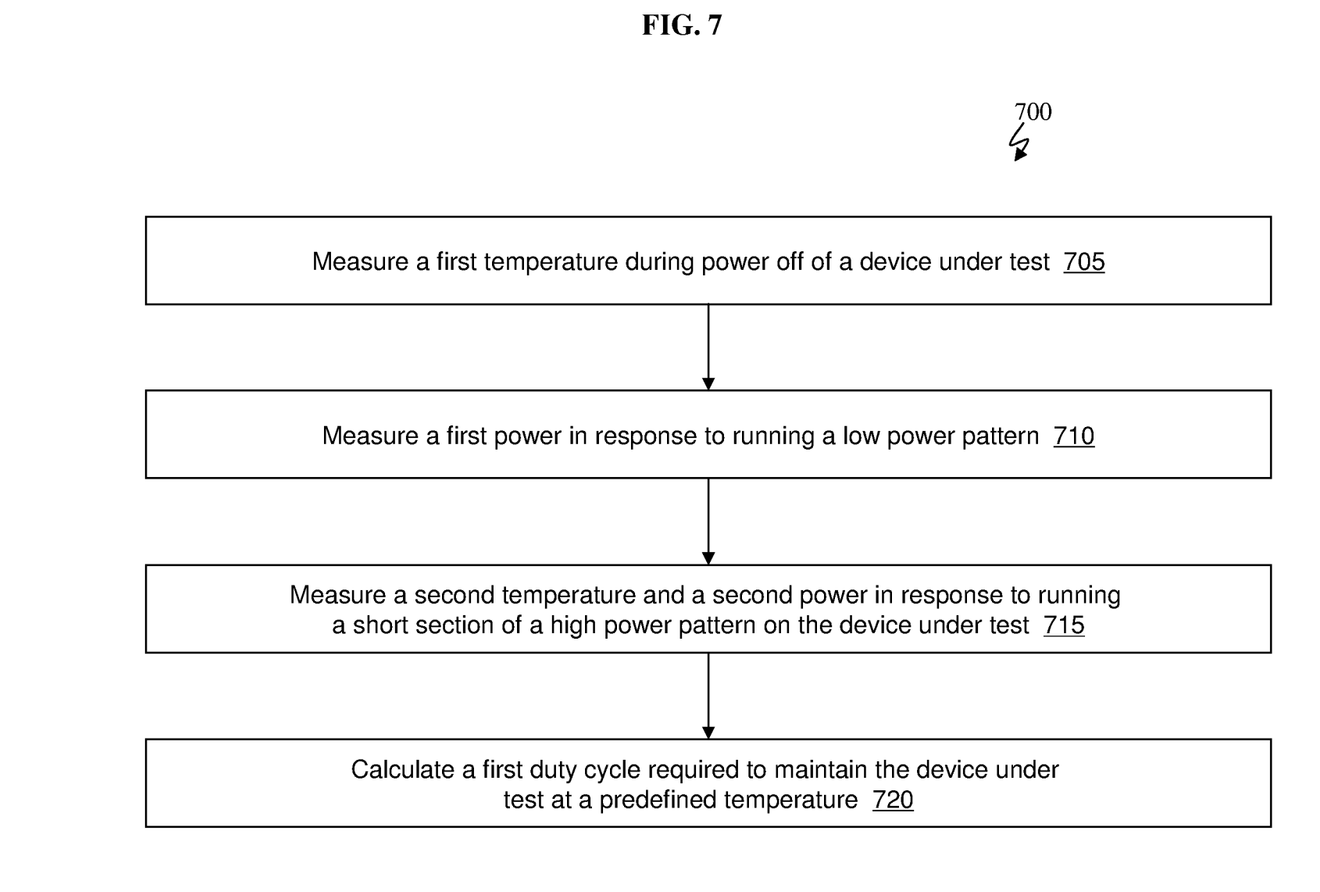
FIG. 7 illustrates a flow chart in accordance with an exemplary embodiment.

As discussed above, the application 115 including the application patterns 140, the control patterns 145, and the timer 150 may execute the method 600 (and a method 700 in FIG. 7). The application 115, application patterns 140, control patterns 145, and timer 150 may be implemented wholly and/or cooperatively on the computer 105, the test socket 110, and/or the chip 120 (i.e., the device under test) according to exemplary embodiments.

The application 115 is configured to interrupt an application pattern 140 running on a device under test such as the chip 120 at block 605.

In response to the application 115 interrupting the application pattern 104 (e.g., according to an interrupt time counted on the timer 150), the application 115 is configured to cause a control pattern to run on the chip 120 (device under test) at block 610.

In response to completion of the control pattern 145 on the chip 120, the application 115 causes the application pattern 140 to restart running on the chip 120 from the point of interruption on the chip 120 (device under test) at block 615. For example, if the application pattern 140 was one-third complete before being interrupted, the application pattern 140 would restart from the point of one-third completion.

Running application pattern 140 on the chip 120 under test causes the chip 120 under test to draw high application power via the test socket 110. Running the control pattern 145 on the chip 120 under test causes the chip 120 under test to draw low power via the test socket 110. The control pattern 145 may be a subroutine that runs on the chip 120 under test to allow device temperature cooling of the chip 120. The application 115 may cause the application pattern 140 to operate in a first region (such as region 405a) of the chip 120 under test and not operate in a second region (such as region 405c) of the chip 120 in order to cause the predefined temperature in the first region and cause a different temperature in the second region. The first region and the second region are at least one of core regions (such as regions 405), memory regions (such as regions 410), and core and memory regions (which in one option may be a few core regions 405 but not all core regions along with a few memory regions 410 but not all memory regions). The application 115 may be configured to cause the application pattern 140 to oscillate between operation in a first region (e.g., memory region 410a) and operation in a second region (e.g., memory region 410b) of the device under test.

Now turning to FIG. 7, FIG. 7 illustrates a method 700 of test equipment for providing interrupt capability for automatic testing via the application 115 according to exemplary embodiments.

The application 115 is configured to measure and/or determine a first temperature (such as $T_{OFF}$) during power off of the chip 120 (the device under test) at block 705.

The application 115 is configured to measure a first power (low power $P_{LO}$) in response to running a control pattern 145 (e.g., for 1 sec) at block 710.

The application 115 is configured to measure a second temperature (application pattern temperature $T_{HI}$) and a second power (application $P_{HI}$) in response to running a short section of the application pattern 140 on the chip 120 under test at block 715. For example, the chip 120 may run 1 sec (or 2, 3, 4, 5 secs) of the application pattern 140 as the short section of the application pattern 140.

The application 115 is configured to calculate a first duty cycle DC required to maintain the chip 120 under test at a predefined temperature (such as, e.g., at the desired temperature 85 C) at block 720. The predefined temperature may be input into the application 115 by a user utilizing an input device such as a mouse and keyboard.

Further, the application 115 is configured to run the application pattern 140 according to the first duty cycle, which interrupts the running of the application pattern 140 according to an interrupt time counted by the timer 150.

The application 115 is further configured to in response to running the application pattern 140 at the first duty cycle for a period of time, measure a third temperature of the chip 120. The application 115 is configured to determine a temperature difference between the third temperature and the predefined temperature (e.g., 85 C). The third temperature may be the chip temperature (or region temperature) after running the chip at the first duty cycle. The application 115 is configured to calculate a second duty cycle (e.g., a new duty cycle) based on the temperature difference between the third temperature and the predefined temperature.

For example, when the temperature difference is zero (which means the third temperature equals the predefined temperature), the application 115 is configured to continue running the application pattern 140 at the first duty cycle to maintain the device under test at the predefined temperature. When the temperature difference is positive (which means the third temperature is above the predefined temperature), the application 115 is configured to run the application pattern 140 at the second duty cycle (new duty cycle) to maintain (i.e., cool) the device under test at the predefined temperature. In this case, the second duty cycle would be calculated to be less than the first duty cycle. When the temperature difference is negative (which means the third temperature is less than the predefined temperature), the application 115 is configured to run the application pattern 140 at the second duty cycle to maintain the device under test at the predefined temperature. In this case, the application 115 would calculate a higher duty cycle as the second duty cycle to cause the chip 120 to increase in chip temperature.

Figure 5:
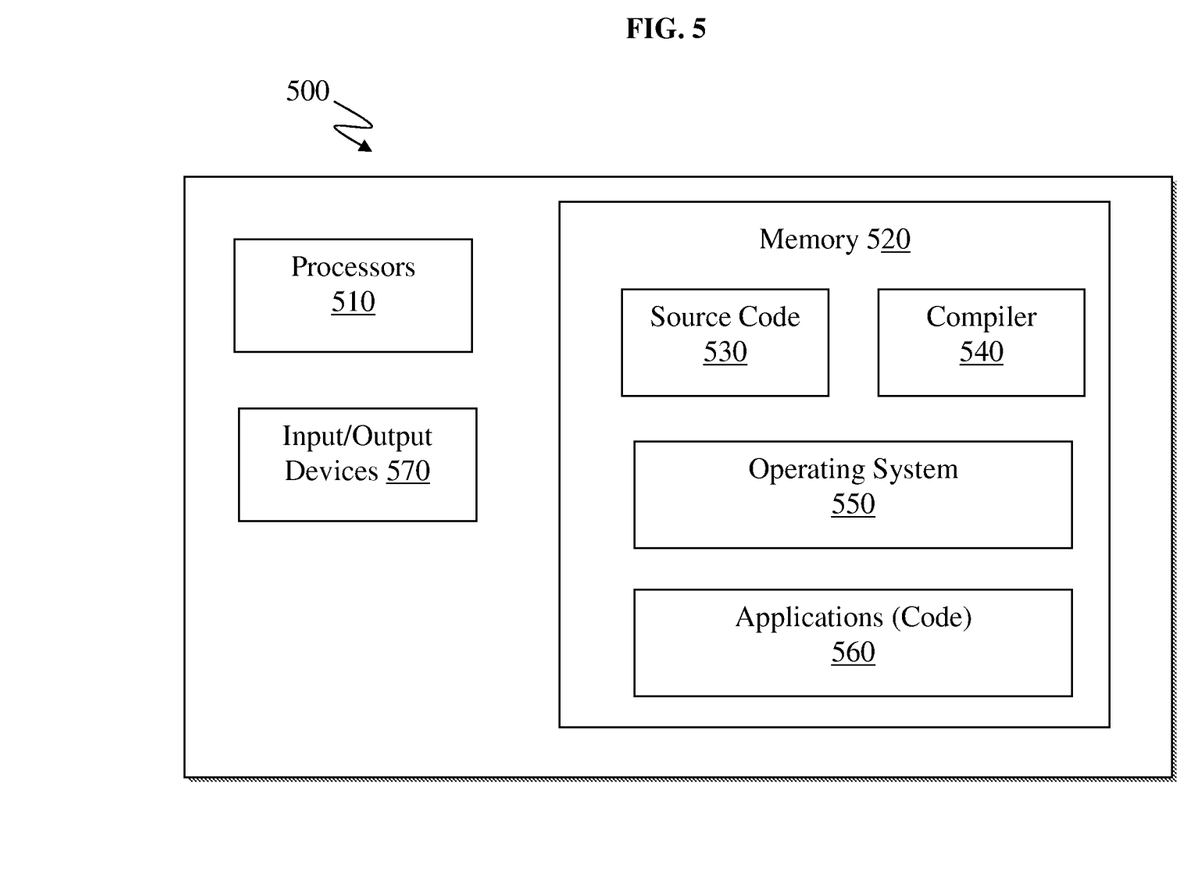
FIG. 5 illustrates an example of a computer having capabilities, which may be included in exemplary embodiments.

Referring to FIG. 5, FIG. 5 illustrates an example of a computer 500 having capabilities, which may be included in exemplary embodiments. Various methods, procedures, modules, flow diagrams, tools, application, architectures, systems, views, and techniques discussed herein may also incorporate and/or utilize the capabilities of the computer 500. Moreover, capabilities of the computer 500 may be utilized to implement features of exemplary embodiments discussed herein. One or more of the capabilities of the computer 500 may implement any element and/or assist in the operation of any element discussed herein such as in FIGS. 1-4, 6, and 7.

Generally, in terms of hardware architecture, the computer 500 may include one or more processors 510, computer readable storage memory 520, and one or more input and/or output (I/O) devices 570 that are communicatively coupled via a local interface (not shown). The processor 510 is a hardware device for executing software that can be stored in the memory 520. The software in the memory 520 includes a suitable operating system (O/S) 550, compiler 540, source code 530, and one or more applications 560 of the exemplary embodiments. The I/O devices 570 may include input devices (or peripherals) and output devices for communicating with the computer 500. When the application 560 is implemented in software it should be noted that the application 560 can be stored on virtually any computer readable storage medium for use by or in connection with any computer related system or method. In the context of this document, a computer readable storage medium may be an electronic, magnetic, optical, or other physical device or means that can contain or store a computer program for use by or in connection with a computer related system or method.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. The instructions may be implemented partially or completely within the DUT, this is generally referred to as BIST, built in self test.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the exemplary embodiments of the invention have been described, it will be understood that those skilled in the art, both now and in the future, may make various improvements and enhancements which fall within the scope of the claims which follow. These claims should be construed to maintain the proper protection for the invention first described.

What is claimed is:

1. A test equipment apparatus for providing interrupt capability for automatic testing, comprises:
   a computer coupled to memory, the computer being responsive to computer-executable instructions contained in the memory; and
   a test socket coupled to a device under test for the automatic testing and coupled to the computer;
   wherein the computer is configured to interrupt an application pattern running on the device under test according to the automatic testing;
   wherein in response to interrupting the application pattern, the computer is configured to cause a control pattern to run on the device under test according to the automatic testing;
   wherein in response to completion of the control pattern, the computer is configured to cause the application pattern to restart running from the point of interruption on the device under test according to the automatic testing;
   wherein the computer is configured to switch, according to a duty cycle for the automatic testing of the device under test, between the application pattern that runs an amount of computational operations and the control pattern that runs a smaller amount of computational operations compared to the application pattern;
   wherein the duty cycle for the automatic testing of the device under test corresponds to a length of time for the application pattern running the amount of computational operations and also corresponds to a different length of time for the control pattern running the smaller amount of computational operations;
   wherein when executing the automatic testing under a worst case scenario for the device under test, respective duty cycles are calculated for a first application pattern, a second application pattern, a third application pattern through a last application pattern in order to run each of the first through the last application patterns for their respective duty cycles;
   wherein the computer is configured to execute the automatic testing for the device under test comprising at least one of a chip, a processor core, and a memory.

2. The apparatus of claim 1, wherein when the application pattern runs on the device under test, the application pattern causes the device under test to draw high application power via the test socket.

3. The apparatus of claim 1, wherein when the control pattern runs on the device under test, the control pattern causes the device under test to draw low power via the test socket.

4. The apparatus of claim 1, wherein the control pattern is a subroutine that runs on the device under test to allow device temperature cooling of the device under test; and
   wherein when being compared to a normal test time, operating the automatic testing with the duty cycle of about 40% results in a 2.5 times increase over the normal test time.

5. The apparatus of claim 1, wherein the computer is configured to cause the application pattern to operate in a first region of the device under test and not operate in a second region in order to cause a predefined temperature in the first region and cause a different temperature in the second region; and
   wherein the first region and the second region are different core regions.

6. The apparatus of claim 1, wherein the computer is configured to:
   in response to running the application pattern for a period of time with the duty cycle, measure a temperature of the device under test; and
   change the duty cycle when there is a temperature difference between the measured temperature and a predefined temperature.

7. The apparatus of claim 1, wherein the computer is configured to cause the application pattern to oscillate between operation in a first region and operation in a second region of the device under test.

8. The apparatus of claim 1, wherein the control pattern is at least one of a nap state and a sleep state for operating the device under test.

9. A method for providing interrupt capability for automatic testing, comprising:
   interrupting, by a computer, an application pattern running on a device under test for the automatic testing;
   in response to interrupting the application pattern, causing, by the computer, a control pattern to run on the device under test according to the automatic testing;
   in response to completion of the control pattern, causing the application pattern to restart running from the point of interruption on the device under test according to the automatic testing; and
   switching, according to a duty cycle for the automatic testing of the device under test, between the application pattern that runs an amount of computational operations and the control pattern that runs a smaller amount of computational operations compared to the application pattern;
   wherein the duty cycle for the automatic testing of the device under test corresponds to a length of time for the application pattern running the amount of computational operations and also corresponds to a different length of time for the control pattern running the smaller amount of computational operations;

wherein when executing the automatic testing under a worst case scenario for the device under test, respective duty cycles are calculated for a first application pattern, a second application pattern, a third application pattern through a last application pattern in order to run each of the first through the last application patterns for their respective duty cycles;

wherein the computer is configured to execute the automatic testing for the device under test comprising at least one of a chip, a processor core, and a memory.

10. The method of claim 9, wherein when the application pattern runs on the device under test, the application pattern causes the device under test to draw high power via a test socket.

11. The method of claim 9, wherein when the control pattern runs on the device under test, the control pattern causes the device under test to draw low power via the test socket.

12. The method of claim 9, wherein the control pattern is a subroutine that runs on the device under test to allow device temperature cooling of the device under test.

13. The method of claim 9, further comprising causing the application pattern to operate in a first region of the device under test and not operate in a second region of the device in order to cause the predefined temperature in the first region and cause a different temperature in the second region; and wherein the first region and the second region are at least one of: core regions, memory regions, and core and memory regions.

14. The method of claim 9, further comprising in response to running the application pattern for a period of time with the duty cycle, measuring a temperature of the device under test; and changing the duty cycle when there is a temperature difference between the measured temperature and a predefined temperature.

15. The method of claim 9, further comprising causing the application pattern to oscillate between operation in a first region and operation in a second region of a multicore processor as the device under test.

16. The method of claim 9, wherein the control pattern is at least one of a nap state and a sleep state for operating the device under test.

* * * * *